United States Patent [19]

Kim

[11] Patent Number: 5,470,769

[45] Date of Patent: Nov. 28, 1995

[54] PROCESS FOR THE PREPARATION OF A THIN FILM TRANSISTOR

[75] Inventor: Jung J. Kim, Seoul, Rep. of Korea

[73] Assignee: Goldstar Co., Ltd., Seoul, Rep. of Korea

[21] Appl. No.: 280,241

[22] Filed: Jul. 25, 1994

Related U.S. Application Data

[63] Continuation of Ser. No. 216, Jan. 4, 1993, abandoned, which is a continuation-in-part of Ser. No. 675,760, Mar. 27, 1991, abandoned.

[30]     Foreign Application Priority Data

Mar. 27, 1990 [KR]   Rep. of Korea ............... 4100/1990

[51] Int. Cl.$^6$ ................................................. H01L 21/86
[52] U.S. Cl. ..................... 437/40; 437/29; 437/84
[58] Field of Search .................... 437/40, 29, 84, 437/913, 41; 148/DIG. 150, DIG. 118, DIG. 117

[56]          References Cited

U.S. PATENT DOCUMENTS

| | | | |
|---|---|---|---|
| 4,433,004 | 2/1984 | Yonezawa et al. | 437/195 |
| 4,646,424 | 3/1987 | Parks et al. | 437/40 |
| 4,933,296 | 6/1990 | Parks et al. | 437/40 |
| 5,053,354 | 10/1991 | Tanaka et al. | 437/40 |
| 5,326,712 | 7/1994 | Bae | 437/40 |

FOREIGN PATENT DOCUMENTS

| | | | |
|---|---|---|---|
| 5914673 | 1/1984 | Japan . | |
| 0299084 | 12/1987 | Japan | 437/225 |
| 0031168 | 2/1988 | Japan | 437/40 |
| 6449272 | 2/1989 | Japan . | |
| 0274431 | 11/1989 | Japan | 437/40 |
| 0043739 | 2/1990 | Japan | 437/40 |
| 0262051 | 3/1990 | Japan | 437/40 |
| 0277165 | 3/1990 | Japan | 437/225 |
| 0237161 | 9/1990 | Japan . | |

*Primary Examiner*—Brian E. Hearn
*Assistant Examiner*—Michael Trinh

[57]           ABSTRACT

A process for the preparation of a thin film transistor is provided which includes sequentially depositing a gate insulating layer, an amorphous silicon layer, and an n+ amorphous silicon layer. The n+ amorphous silicon layer is disposed between source and drain electrodes and is oxidized by a plasma oxidation process so that switching properties, interface properties between the amorphous silicon layer and the n+ amorphous silicon layer and a production yield are enhanced, while the preparation steps of forming an etch stopper and removing the n+ amorphous silicon layer disposed between the source electrode and the drain electrode are reduced.

2 Claims, 2 Drawing Sheets

FIG. 1
CONVENTIONAL ART
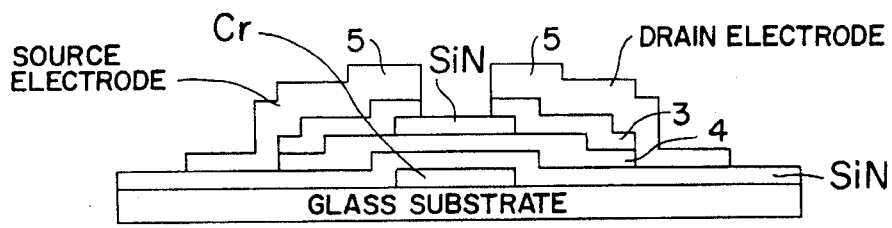
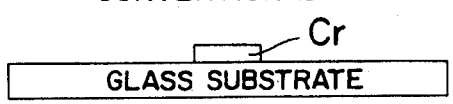
FIG. 2(a)
CONVENTIONAL ART
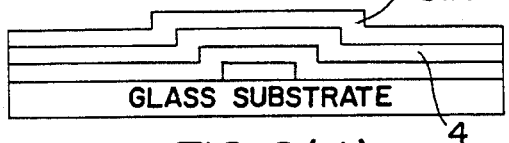
FIG. 2(b)
CONVENTIONAL ART
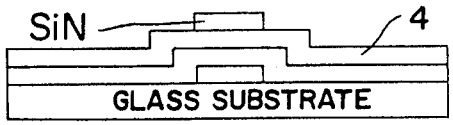
FIG. 2(c)
CONVENTIONAL ART
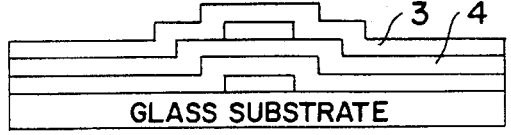
FIG. 2(d)
CONVENTIONAL ART
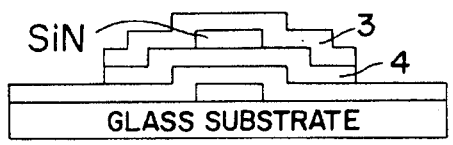
FIG. 2(e)
CONVENTIONAL ART
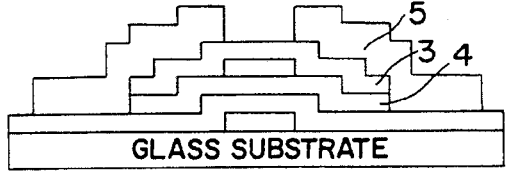
FIG. 2(f)
CONVENTIONAL ART
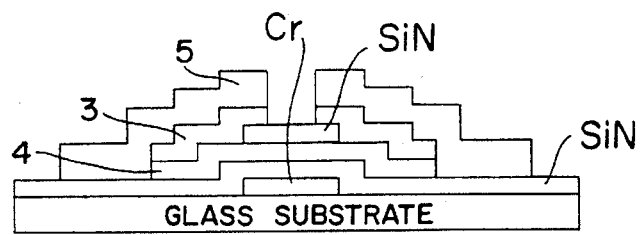
CONVENTIONAL ART
FIG. 2(g)

PROCESS FOR THE PREPARATION OF A THIN FILM TRANSISTOR

This application is a continuation, of application Ser. No. 08/000,216 filed on Jan. 4, 1993, now abandoned; which was a continuation in part application of Ser. No. 07/675,760 filed Mar. 27, 1991 now abandoned.

BACKGROUND OF THE INVENTION

1. Field of the Invention

The present invention relates to a process for the preparation of a thin film transistor and more particularly, to a fabrication process of a thin film transistor that reduces the fabrication steps, saves manufacturing costs, and enhances the operating property, durability and the interface property.

2. Description of the Related Art

Several thin film transistors (hereinafter TFT) are well known in the art. One such conventional TFT is shown in FIG. 1. Such a conventional TFT, as shown in FIG. 1, includes a laminated structure in which a gate electrode of Cr on a glass substrate, a gate insulating layer of SiN, an amorphous silicon layer 4, an etch stopper layer of SiN, an n+ amorphous silicon layer 3 doped with impurities, and an aluminum layer 5 used as a drain electrode and a source electrode laminated sequentially.

As shown in FIGS. 2(a) to 2(g), a process for the preparation of the conventional TFT discussed above includes the steps of depositing and patterning a gate layer of Cr on a glass substrate to provide a gate electrode (FIG. 2(a)); depositing sequentially a gate insulating layer of SiN, an amorphous silicon layer 4 as a semiconductor and an etch stopper layer of SiN over the gate electrode (FIG. 2(b)); patterning the etch stopper layer of SiN to provide an etch stopper layer (FIG. 2(c)); depositing an n+ amorphous silicon layer 3 (FIG. 2(d)); patterning the n+ amorphous silicon layer 3 and the amorphous silicon layer 4 (FIG. 2(e)); depositing and patterning the aluminum layer 5 to provide source and drain electrodes (FIG. 2(f)); and etching the n+ amorphous silicon layer by an RIE (Reactive Ion Etching) Process (FIG. 2 (g)).

However, because such a conventional TFT preparation process uses the RIE process, it is very difficult to control the etching depth of the n+ amorphous silicon layer 3 when the n+ amorphous silicon layer 3 is etched by the RIE process. Therefore, in the case where the n+ amorphous silicon layer 3 is etched by the RIE process, most careful attention is required in order not to etch the amorphous silicon layer together with the n+ amorphous silicon layer. It is why the conventional TFT does need an etch stopper layer between the amorphous silicon layer and the n+ amorphous silicon layer to prevent the amorphous silicon layer from being etched together with the n+ amorphous silicon layer.

Also, the interface property between the n+ amorphous silicon layer and the amorphous silicon layer could be deteriorated because the steps of depositing and patterning the etch stopper layer has to be performed before the step of depositing the n+ amorphous silicon layer.

The deterioration of the interface property between the n+ amorphous silicon layer and the amorphous silicon layer are caused by the following reasons:

1) an exposure to the atmosphere could easily oxidize the n+ amorphous silicon layer on its exposed surface, which results in deterioration in property;

2) the patterning of the etch stopper layer of SiN by etching could affect the surface of the amorphous silicon layer.

Accordingly, as described above, the conventional preparation steps are complicated and difficult because additional steps for depositing and patterning the etch stopper layer of SiN are required. Also, the interface property between the n+ amorphous silicon layer and the amorphous silicon layer is deteriorated because the sequential depositions of the n+ amorphous silicon layer on the amorphous silicon layer cannot be carried out by adding the depositing and patterning steps of the etch stopper layer of SiN.

SUMMARY OF THE INVENTION

Accordingly, it is an object of the present invention to provide an improved process for the preparation method of a thin film transistor which enhances the operating properties while the preparation steps are reduced.

An object of the present invention is to provide a simplified process for the TFT preparation method which reduces manufacturing costs by using a step of oxidizing an exposed portion of a conducting layer of n+ amorphous silicon into $SiO_2$ as an insulator by means of plasma oxidation, instead of using the steps of depositing and patterning an etch stopper layer of SiN and etching an exposed portion of an n+ amorphous silicon layer.

Another object of the present invention is to provide an improved process for the TFT preparation method which increases an interface property between the n+ amorphous silicon layer and the amorphous layer by sequentially depositing the amorphous silicon and the n+ amorphous silicon over the gate electrode.

A further object of the present invention is to provide an improved process for the TFT preparation method which provides a protective layer on the outer surface of the source and the drain electrode by means of the plasma oxidation at the same time when the n+ amorphous silicon layer is oxidized by means of the plasma oxidation.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a sectional view of a conventional thin film transistor in a conventional sequence;

FIGS. 2(a) to 2(g) illustrate process steps of the conventional thin film transistor in a conventional sequence;

DESCRIPTION OF THE PREFERRED EMBODIMENTS OF THE PRESENT INVENTION

Figure 3:
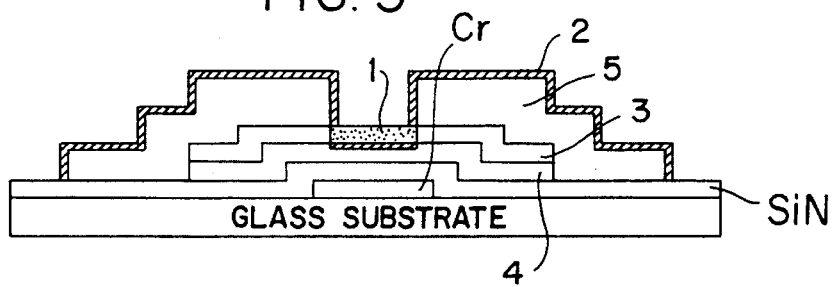
FIG. 3 is a sectional view of the thin film transistor according to an embodiment of the present invention.
Figure 4A:
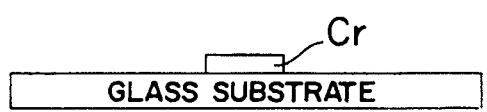
FIGS. 4(a) to 4(e) illustrate the process steps according to an embodiment of the present invention.
Figure 4B:
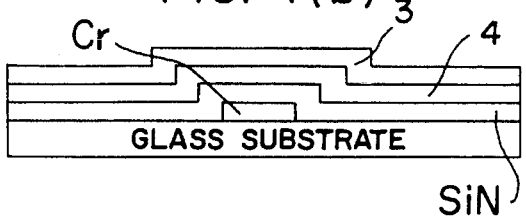
Figure 4C:
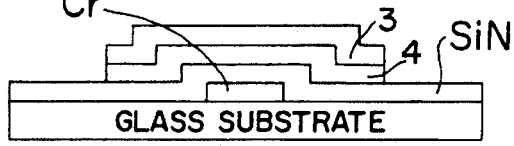
Figure 4D:
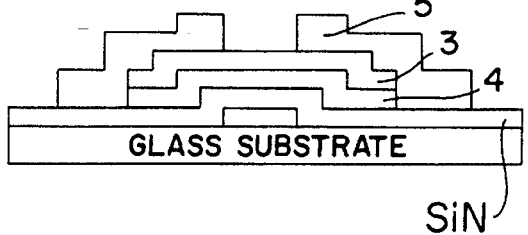
Figure 4E:
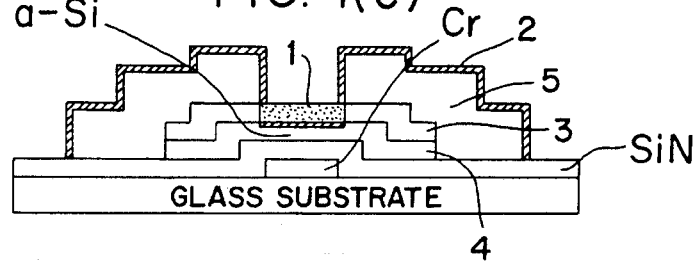

Referring now in detail to the drawings for the purpose of illustrating the preferred embodiments of the present invention in FIGS. 3 and 4.

A TFT according to an embodiment of the present invention is shown in FIG. 3. As shown in FIG. 3, the TFT of the present embodiment includes a gate layer of Cr disposed on a glass substrate, a gate insulating layer of SiN, an amorphous silicon layer 4, an n+ amorphous silicon layer 3 doped with impurities, a $SiO_2$ layer 1, source and drain electrodes of aluminum, and an $Al_2O_3$ layer 2 as a protection layer of the source and drain electrodes.

The fabrication method for the thin film transistor of the present embodiment is described as follows.

A process for the TFT preparation is shown in FIGS. 4(a) to 4(e). As shown in FIGS. 4(a) to 4(e), a process of the present embodiment includes the steps of depositing a gate electrode of Cr on a glass substrate and patterning it (FIG. 4(a)) depositing a gate insulating layer of SiN, an amorphous silicon layer 4 and an n+ amorphous silicon layer 3 sequentially (FIG. 4(b)); patterning the amorphous silicon layer 4 and the n+ amorphous silicon layer 3, at the same time, (FIG. 4(c)); depositing and patterning an aluminum layer 5 to provide source and drain electrodes (FIG. 4(d)); and oxidizing the source and drain electrodes and a portion of n+ amorphous silicon exposed between the drain and source electrodes to form a protective layer on the outer surface of the drain and source electrodes and $SiO_2$ between the drain and source electrodes (FIG. 4(e)). In the step of oxidizing, it is preferable to further oxidize a portion of amorphous silicon disposed between the source electrode and the drain electrode to a predetermined depth for better insulating property.

Also, by applying the plasma oxidation process on the surfaces, a protection layer 2 of $Al_2O_3$ is formed so that it is possible to protect the source and drain electrodes from unexpected external noise.

It is desirable that the plasma oxidation process be conducted under conditions wherein $O_2$ is 10 SCCM to 20 SCCM, the temperature is 250° C.–300° C. and the chamber atmospheric pressure is 0.1 torr to 1 torr.

In such a fabrication method, the n+ amorphous silicon layer 3 between the source electrode and the drain electrode is used to form the $SiO_2$ insulating layer 1 by the plasma oxidation process. Also the $Al_2O_3$ layer 2 of the insulating membrane is easily formed on the surface of the aluminum layer 5 so that the process of TFT preparation is advantageously simple, the properties of the TFT are enhanced and the yield rate is improved as compared to conventional fabrication processes.

As described above, since the present invention does not require the steps of removing the exposed portion of the n+ amorphous silicon layer and providing the etch stopper layer, the present invention can simplify the process for the TFT preparation, save the manufacturing costs, and increase the interface property and the yield rate, or the productivity, compared to the conventional TFT fabrication process.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A process for the preparation of a thin film transistor, comprising the steps of:

providing a gate electrode on a glass substrate;

depositing a gate insulating layer, an amorphous silicon layer, and an $n^+$ amorphous silicon layer over said gate electrode;

patterning said amorphous silicon layer and said $n^+$ amorphous silicon layer at the same time;

depositing and patterning an aluminum layer over said $n^+$ amorphous silicon layer and said gate insulating layer to provide a source electrode and a drain electrode and an exposed portion of said $n^+$ amorphous silicon layer between said source electrode and said drain electrode in a channel of the thin film transistor; and oxidizing said exposed portion of said $n^+$ amorphous silicon layer between said source electrode and said drain electrode, and a surface of said source electrode and a surface of said drain electrode at the same time by means of a plasma oxidation process so as to provide a channel in said amorphous silicon layer and leave a passivation layer on said source electrode and drain electrode which is not removed.

2. A process as claimed in claim 1, wherein a portion of said amorphous silicon layer disposed between said source electrode and said drain electrode is further oxidized through said portion of said n+ amorphous silicon layer.

* * * * *